US011935976B2

(12) United States Patent
Linder et al.

(10) Patent No.: US 11,935,976 B2
(45) Date of Patent: Mar. 19, 2024

(54) ROOM TEMPERATURE METHOD FOR THE PRODUCTION OF ELECTROTECHNICAL THIN LAYERS, AND A THIN LAYER SEQUENCE OBTAINED FOLLOWING SAID METHOD

(71) Applicant: DYNAMIC SOLAR SYSTEMS AG, Frankfurt (DE)

(72) Inventors: Patrick Linder, Lehrberg (DE); Daniel Linder, Lehrberg (DE)

(73) Assignee: DYNAMIC SOLAR SYSTEMS AG, Frankfurt (DE)

( * ) Notice: Subject to any disclaimer, the term of this patent is extended or adjusted under 35 U.S.C. 154(b) by 0 days.

(21) Appl. No.: 15/554,064

(22) PCT Filed: Feb. 26, 2016

(86) PCT No.: PCT/DE2016/100083
§ 371 (c)(1),
(2) Date: Aug. 28, 2017

(87) PCT Pub. No.: WO2016/134703
PCT Pub. Date: Sep. 1, 2016

(65) Prior Publication Data
US 2018/0040432 A1     Feb. 8, 2018

(30) Foreign Application Priority Data

| Feb. 26, 2015 | (DE) | ............... | 10 2015 102 801.8 |
| Dec. 2, 2015 | (DE) | ............... | 10 2015 015 435.4 |
| Dec. 6, 2015 | (DE) | ............... | 10 2015 015 600.4 |

(51) Int. Cl.
H01L 31/02     (2006.01)
H01G 9/20     (2006.01)
(Continued)

(52) U.S. Cl.
CPC ......... *H01L 31/046* (2014.12); *H01G 9/2004* (2013.01); *H01G 9/2095* (2013.01);
(Continued)

(58) Field of Classification Search
None
See application file for complete search history.

(56) References Cited

U.S. PATENT DOCUMENTS

| 3,930,257 A | 12/1975 | Quang et al. |
| 4,040,925 A | 8/1977 | McGinniss |

(Continued)

FOREIGN PATENT DOCUMENTS

| AT | 36002 | 8/1988 |
| CA | 2467690 | 6/2003 |

(Continued)

OTHER PUBLICATIONS

International Search Report for PCT/DE2016/100083, English Translation attached to original, Both completed by the European Patent Office dated Jul. 26, 2016, All together 5 Pages.

*Primary Examiner* — Dustin Q Dam
(74) *Attorney, Agent, or Firm* — Rivka Friedman

(57) ABSTRACT

A method of forming PV layers in which, during the curing process, an additional reaction accelerates and improves curing. In a particularly advantageous embodiment, a double layer sequence having a plastic matrix in which continuous metal particles and, in the upper layer, alkaline-solubilised siloxane portions and metal particles are provided, allows, by means of combined definitive curing during the alkaline-solubilisation, the production of a PV layer sequence with which industrial waste heat/long-wave IR radiation can be utilised photovoltaically. The active exploitation of industrial waste heat/heat/body heat offers clear, financially-viable advantages in a great number of fields.

5 Claims, 4 Drawing Sheets

|⸺⸺⸺⸺⸺ 160 micrometers ⸺⸺⸺⸺⸺|

(51) Int. Cl.
*H01L 21/02* (2006.01)
*H01L 31/046* (2014.01)

(52) U.S. Cl.
CPC .. *H01L 21/02422* (2013.01); *H01L 21/02601* (2013.01); *H01L 21/02628* (2013.01); *H01L 31/02* (2013.01)

(56) References Cited

U.S. PATENT DOCUMENTS

| | | | |
|---|---|---|---|
| 4,911,992 | A | 3/1990 | Haluska et al. |
| 4,915,984 | A | 4/1990 | Murakami |
| 5,272,017 | A | 12/1993 | Swathirajan et al. |
| 6,416,818 | B1 | 7/2002 | Aikens |
| 6,863,923 | B1 | 3/2005 | Kalleder et al. |
| 8,043,909 | B2 | 10/2011 | Ebbers et al. |
| 8,101,097 | B2 | 1/2012 | Bahnmuller et al. |
| 2004/0131934 | A1 | 7/2004 | Sugnaux et al. |
| 2005/0208328 | A1* | 9/2005 | Hsu ................ H01G 11/56 428/690 |
| 2006/0159838 | A1* | 7/2006 | Kowalski ........... H05K 3/1208 427/299 |
| 2006/0199313 | A1 | 9/2006 | Harting et al. |
| 2008/0182011 | A1 | 7/2008 | Ng et al. |
| 2009/0026458 | A1 | 1/2009 | Ebbers et al. |
| 2010/0040846 | A1 | 2/2010 | Bahnmüller et al. |
| 2010/0122726 | A1 | 5/2010 | Lee |
| 2010/0301375 | A1* | 12/2010 | Chen ................. H01L 51/5246 257/99 |
| 2011/0008575 | A1 | 1/2011 | Sasaki et al. |
| 2011/0081575 | A1 | 4/2011 | Voelker et al. |
| 2011/0248370 | A1* | 10/2011 | Tsoi ............... H01L 31/03529 257/437 |
| 2013/0143071 | A1 | 6/2013 | Kleinle |
| 2014/0027774 | A1* | 1/2014 | Li ................. H01L 31/1055 257/53 |
| 2014/0161972 | A1 | 6/2014 | Dong et al. |
| 2014/0326316 | A1* | 11/2014 | Radu ............... H01L 21/02628 423/511 |
| 2015/0059850 | A1* | 3/2015 | Wu ................ H01L 31/056 136/259 |
| 2015/0155403 | A1 | 6/2015 | Torardi et al. |
| 2017/0025612 | A1* | 1/2017 | Rhodes .............. H01L 51/052 |

FOREIGN PATENT DOCUMENTS

| | | |
|---|---|---|
| CN | 103214340 | 7/2013 |
| CN | 103293600 | 9/2013 |
| CN | 103839605 | 6/2014 |
| DE | 390400 | 2/1924 |
| DE | 410375 | 3/1925 |
| DE | 839396 | 5/1952 |
| DE | 1446978 | 2/1969 |
| DE | 2004076 | 8/1971 |
| DE | 3106654 | 12/1981 |
| DE | 266693 | 4/1989 |
| DE | 3784645 | 9/1993 |
| DE | 3650278 | 9/1995 |
| DE | 19647935 | 5/1998 |
| DE | 19815291 | 10/1999 |
| DE | 19946712 | 4/2001 |
| DE | 102007014608 | 9/2008 |
| DE | 102007014608 A1 | 9/2008 |
| DE | 102012107100 | 2/2014 |
| DE | 102012107100 A1 | 2/2014 |
| EP | 2119747 | 11/2009 |
| JP | H04249379 | 9/1992 |
| TW | 201442271 | 11/2014 |
| WO | 2007017192 | 2/2007 |
| WO | 2011021982 | 2/2011 |
| WO | 2012000001 | 1/2012 |
| WO | 2014019560 | 2/2014 |

\* cited by examiner

|--------------------- 160 micrometers ---------------------|

Fig. 4b PRIOR ART
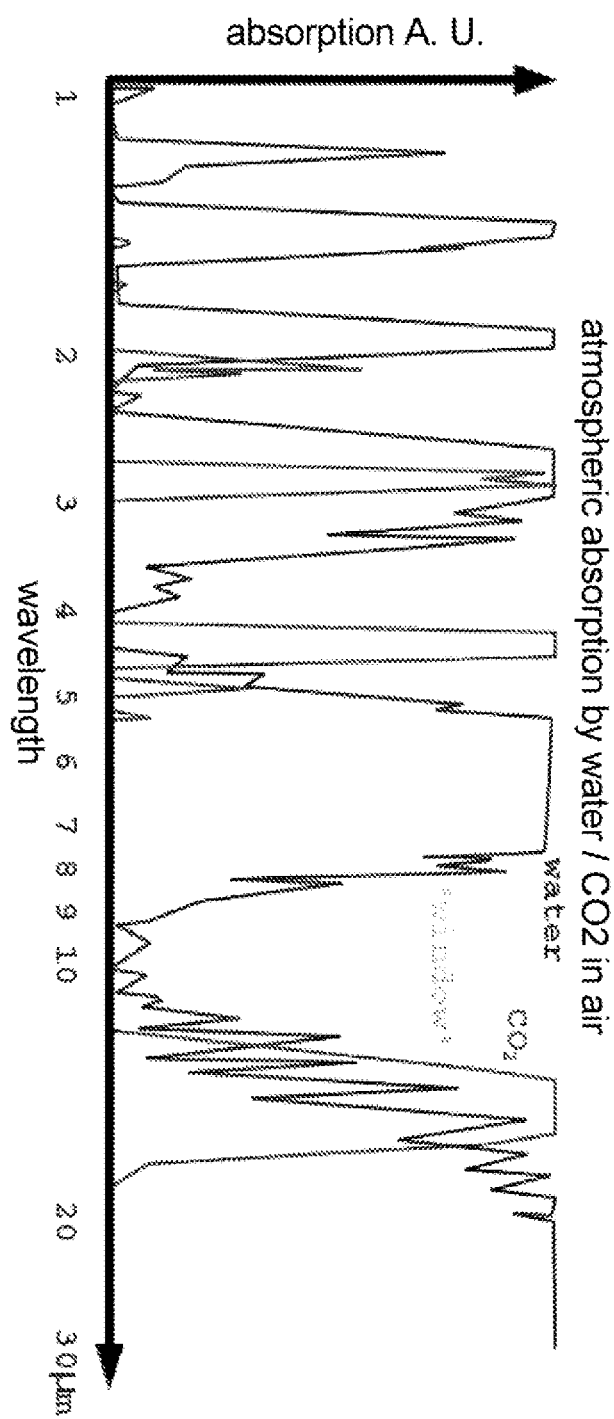

ROOM TEMPERATURE METHOD FOR THE PRODUCTION OF ELECTROTECHNICAL THIN LAYERS, AND A THIN LAYER SEQUENCE OBTAINED FOLLOWING SAID METHOD

CROSS-REFERENCE TO RELATED APPLICATION

This application is the U.S. national phase of PCT Application No. PCT/DE2016/100083 filed on Feb. 26, 2016, which claims priority to DE Patent Application No. 10 2015 102 801.8 filed on Feb. 26, 2015, and to DE Patent Application No. 10 2015 015 435.4 filed on Dec. 2, 2015, and to DE Patent Application No. 10 2015 015 600.4 filed on Dec. 6, 2015, the disclosures of which are incorporated in their entirety by reference herein.

TECHNICAL FIELD

The present invention may generally be classified in the field of electrotechnical thin layers. The technical field is usefully outlined in DE 10 2015 102 801 in which the present inventors have been involved. Known measures, features and methods may be discerned from this application and the prior art cited therein. Layers of the type in question which have thicknesses in the micrometer range and may be carried flexibly on movable, foldable and bendable carriers are generally known. Thus, AT 36002 E, publication number 0 119 051 B2, of BASF Corp. discloses appropriate acrylate-based coatings which may be used as a covering for flexible substrates. Typical constituents, properties and measures for producing such layers are discernible from this document.

DESCRIPTION OF THE PRIOR ART

The present invention relates to processes for producing electrotechnical thin layers, in particular electrotechnical PV layer sequences.

PV layer sequences have long been the subject of research and development. Mono- and polycrystalline Si cells, appropriately weld-wrapped and contacted and also arranged outdoors in solar parks for large-area power generation, are established product examples in the relevant technical field. The problem is that these classical cells are rigid and rather inflexible. The areally extending panels must always be oriented in the horizontal plane toward the position of the sun to ensure optimal yields. Flexible thin layer systems which provide for carrying of electrotechnical thin layers, from conducting and switching layers, through PV layers to covering and protective layers, come into play here. The applicant is active in this specific field and with the present application claims a process for producing such layers and layer composites and a layer sequence obtained in accordance with the process.

Protective and conductive layers, of layers and PV layer sequences of the type in question, are naturally conductive and/or flexible. Appropriate conductive and protective layers are disclosed for example in DE 198 15 291 B4 and the prior art cited therein.

Established PV conductive layers and processes for the production of such PV layer composites are disclosed in DE 199 46 712 A1. The disadvantage is that the solvents and sinter-reactive substances present require temperatures of 150 degrees Celsius or more to be able to be fully removed during a final thermal consolidation; in the practical product example the final thermal consolidation is undertaken at 450 degrees Celsius here.

In light of these problems EP 2 119 747 B1 proposes conducting silver compositions which at around 100 degrees Celsius may be sintered via hyperreactive metal nanoparticles to afford uninterrupted conductor tracks. However, even this measure does not make it possible to produce electrotechnical thin layers, in particular PV layer sequences, on substrates dispensing with a sintering step: heating of the printed thin layers to a sintering temperature around 100° C.—in the exemplary embodiment 130° C.—is always necessary.

The problem addressed by the present invention was accordingly that of overcoming the disadvantages of the prior art and providing a process and an electrotechnical thin layer according to the process which despite an industrial process regime and large surface area fabrication can, without heating to a sintering temperature, provide thin layers which are solid, stable and virtually 100% reversible in their electrotechnical properties.

The solution to this problem is effected according to the features of the independent claims. Advantageous embodiments are discernible from the dependent claims and the description which follows.

SUMMARY OF THE INVENTION

According to the invention a room temperature process for producing electrotechnical thin layers where electrically conducting and/or semiconducting inorganic agglomerates are areally provided in a dispersion and hardened to afford a layer provides that the hardening is performed at room temperature and the hardening is accelerated by exposure to at least one reagent.

An electrotechnical thin layer sequence obtained according to the process and obtained as a PV layer sequence is characterized in that the thin layer sequence comprises a glass carrier, comprises an electrode layer applied atop the glass carrier, comprises a first layer applied atop the electrode layer which comprises aluminum particles in a plastics matrix, comprises a second layer applied atop the first layer which comprises as an at least partially basic, glasslike layer at least silicon-oxygen bridges in a glasslike network and further comprises at least partially base-solubilized aluminum particles as inorganic agglomerates, comprises a transparent covering electrode applied atop the second layer and having contact electrodes, wherein in turn the thus prepared PV layer sequence exhibits a photovoltaic effect in the long wave and extreme long wave infrared range.

DESCRIPTION OF THE INVENTION AND ADVANTAGEOUS FEATURES

According to the invention a room temperature process for producing electrotechnical thin layers, wherein electrically conducting and/or semiconducting inorganic agglomerates are areally provided in a dispersion and hardened to afford a layer, is characterized in that the hardening is performed at room temperature and the hardening is accelerated by exposure to at least one reagent.

The process is preferably characterized in that a PV layer sequence is formed.

The process is preferably characterized in that as at least one base layer a layer is applied which comprises at least one metal or a metal compound, wherein the at least one metal or its compound is selected from the group consisting of steel, zinc, tin, silver, copper, aluminum, nickel, lead, iron.

The process is preferably characterized in that as a conductive base layer at least one metallic conductive and/or semiconducting layer is applied and at least partially hardened.

The process is preferably characterized in that as a carrier an areally extending material web is used, the material web consisting of at least one material selected from the material group consisting of glass, plastic, polycarbonate, plastics film, metal alloy, motor block alloy, heat exchanger tube alloy, heat exchanger alloy, heat exchanger soldering alloy, ceramic, industrial ceramic, natural stone, marble, clay ceramic, roof tile ceramic, laminate wood material, floorboard material, aluminum, stairway aluminum alloy, printed circuit board composites, integrated circuit housing material, processor housing compounds.

The process is preferably characterized in that the inorganic agglomerates of a first layer are metals or metal compounds distributed in a plastics matrix, the metal type of the metals or metal compounds selected from the group consisting of beryllium, boron, aluminum, gallium, indium, silicon, germanium, tin, lead, arsenic, antimony, selenium, tellurium, copper, silver, gold, zinc, iron, chromium, manganese, titanium, zirconium.

The process is preferably characterized in that the inorganic agglomerates of a second layer are metals or metal compounds, which are arranged distributed in an at least partially inorganic matrix, wherein the metal type of the metals or metal compounds is selected from the group consisting of beryllium, boron, aluminum, gallium, indium, silicon, germanium, tin, lead, arsenic, antimony, selenium, tellurium, copper, silver, gold, zinc, iron, chromium, manganese, titanium, zirconium.

The process is preferably characterized in that in a layer, as an inorganic matrix, a matrix is used which comprises as the glasslike oxidic matrix at least one chain forming or modifying element, the element selected from the group consisting of boron, phosphorous, silicon, arsenic, sulfur, selenium, tellurium, carbon in amorphous form, carbon in the graphite modification, carbon in the form of carbon nanotubes, carbon in the form of multiwalled carbon nanotubes, carbon in the form of Buckminster fullerenes, calcium, sodium, aluminum, lead, magnesium, barium, potassium, manganese, zinc, tin, antimony, cerium, zirconium, titanium, strontium, lanthanum, thorium, yttrium, fluorine, chlorine, bromine, iodine.

The process is preferably characterized in that
an electrically conductive electrode layer is applied atop a carrier,
metals or metal compounds distributed in a plastics matrix are applied atop the electrode layer as inorganic agglomerates in a first layer,
a second layer of inorganic metallic agglomerates in an at least partially strongly basic or strongly acidic oxidic matrix are applied atop the first layer, wherein
during application and hardening the metallic agglomerates react with the strongly acidic or basic matrix, wherein in turn the matrix also reacts with metallic agglomerates of the first layer,
during hardening and reacting a photovoltaically active junction is formed,
the second layer is provided with a transparent covering electrode and/or a contact electrode and
the photovoltaically active layer sequence is suitably contacted and weld-wrapped as a PV layer sequence.

BRIEF DESCRIPTION OF THE FIGURES

The figures elucidate with reference to in-principle sketches . . . .

FIG. 4b light absorption maxima of H2O in the air as a function of the wavelength according to the prior art provided for elucidation of the behavior illustrated in FIG. 4.

DETAILED ELUCIDATION OF THE INVENTION BY REFERENCE TO EXEMPLARY EMBODIMENTS

In an advantageous embodiment an electrotechnical thin layer sequence obtained as a PV layer sequence by the process according to the invention, is characterized in that the thin layer sequence
comprises a glass carrier,
comprises an electrode layer applied atop the glass carrier comprising silver,
comprises a first layer applied atop the electrode layer which comprises aluminum particles in a plastics matrix,
comprises a second layer applied atop the first layer which comprises as an at least partially basic, glasslike layer at least silicon-oxygen bridges in a glasslike network and further comprises at least partially base-solubilized aluminum particles as inorganic agglomerates,
comprises a transparent covering electrode applied atop the second layer and having contact electrodes, wherein in turn
the thus prepared PV layer sequence exhibits a photovoltaic effect in the long wave and extreme long wave infrared range.

Figure 1:
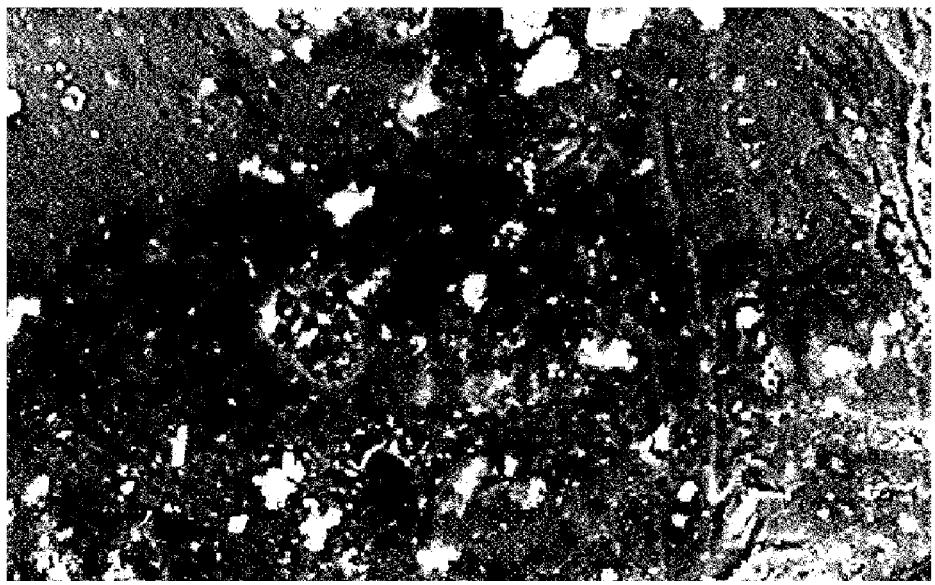
FIG. 1 SEM plan view of a PV double layer comprising on the top side a plastics matrix comprising a siloxane fraction and Al flakes carried and partially solubilized therein applied and hardened atop a pure pre-hardened plastics matrix comprising the same Al flakes.
Figure 2:
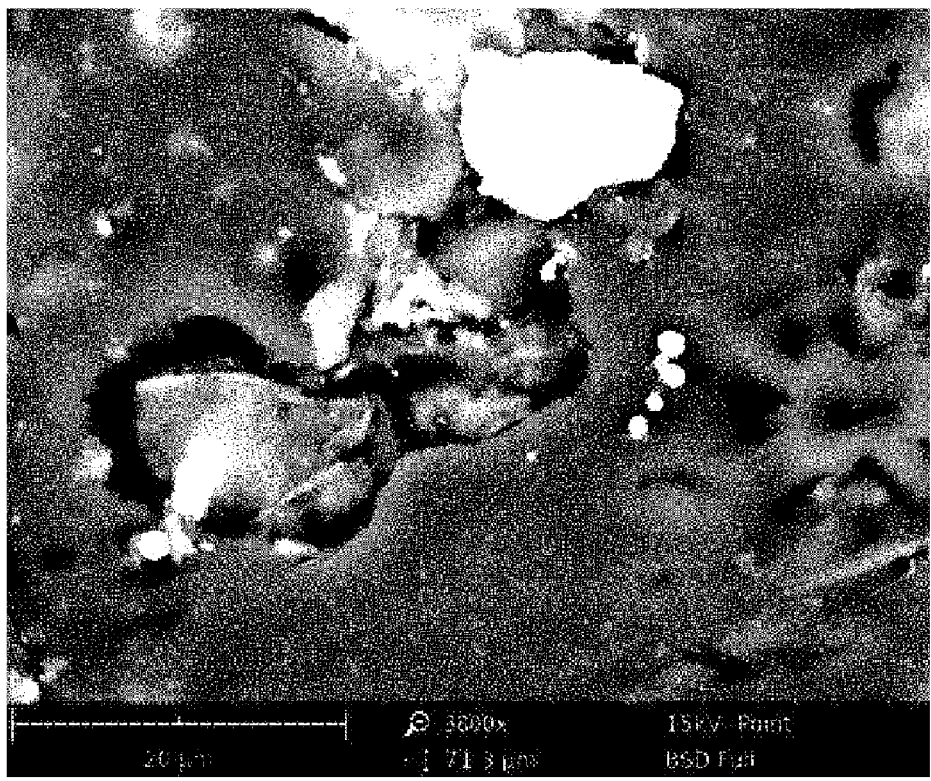
FIG. 2 magnified section of the SEM image according to FIG. 1.
Figure 3:
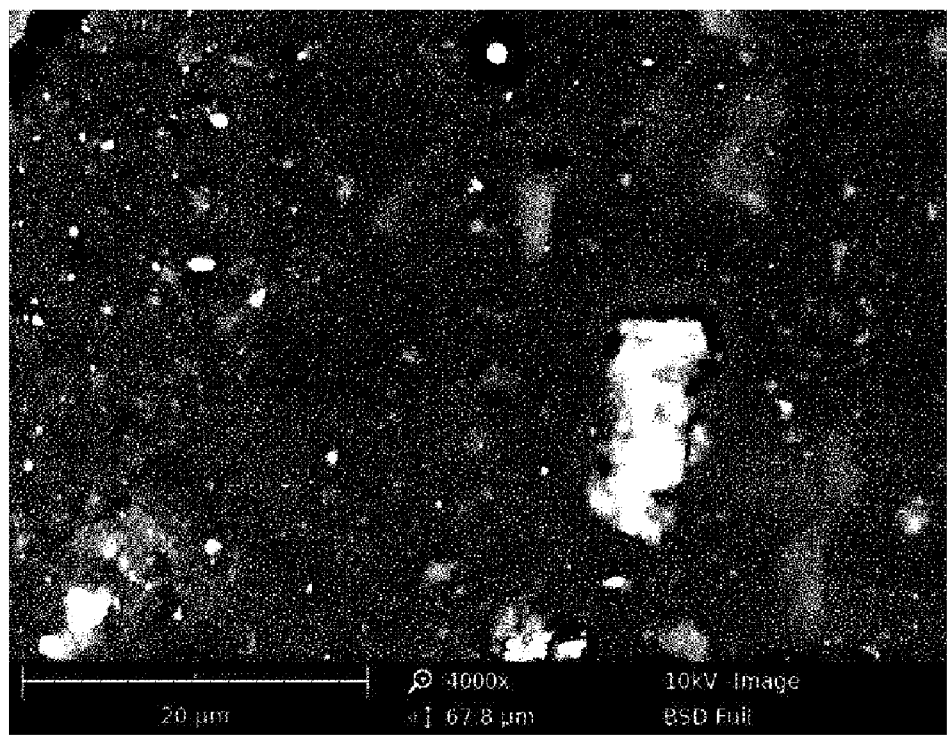
FIG. 3 SEM image of the bottom side of a PV double layer according to FIGS. 1 and 2.

In a further advantageous embodiment an acrylate-based paint for the outer region is admixed with aluminum flakes (pigment addition of the paint industry for paints having a silver appearance), homogenized and a first layer is deposited on a glass carrier having an area of around 10 cm×10 cm which was previously preparatively coated with a semitransparent, electrically conductive metal layer. The acrylate-based layer comprising aluminum flakes is prehardened in the air at room temperature for 5 minutes. Subsequently a second mixture of the same acrylate-based paint is made up with aluminum flakes, admixed with silica sol and in a cooled stirrer adjusted to basic pH with aqueous sodium hydroxide solution and homogenized. The still-reacting mixture is applied as a second layer atop the first prehardened layer and uniformly and coveringly distributed. The parallel reaction where the aluminum is at least partially solubilized accelerates the final hardening of both layers. The thus obtained layer composite is provided on its top side with a finger electrode made of room temperature conducting silver from Busch. As shown by FIG. 1 in a scanning electron microscope image (SEM) the thus obtained layer on its top side is characterized by a plastics matrix in which the base-dissolved water glass provides a siloxane fraction. The Al flakes carried in the matrix are solubilized and securely integrated into the plastics matrix. As taught by FIG. 2 the Al flakes pass through the plastics layer to the surface and allow a direct electrical contacting of a scaffolding made of Al flakes conductingly interconnected via contact points and short electrolyte bridges. Detachment of a flexible segment of the plastics double layer using a scalpel showed that the double layer is present as a flexible, solid, removable composite; the removed segment was tested on its bottom side by SEM. As is shown by FIG. 3 in an SEM image, on the bottom side too Al flakes are present and in areal contact with the phase interface of the semitransparent electrode and allow electrical contact.

Figure 4A:
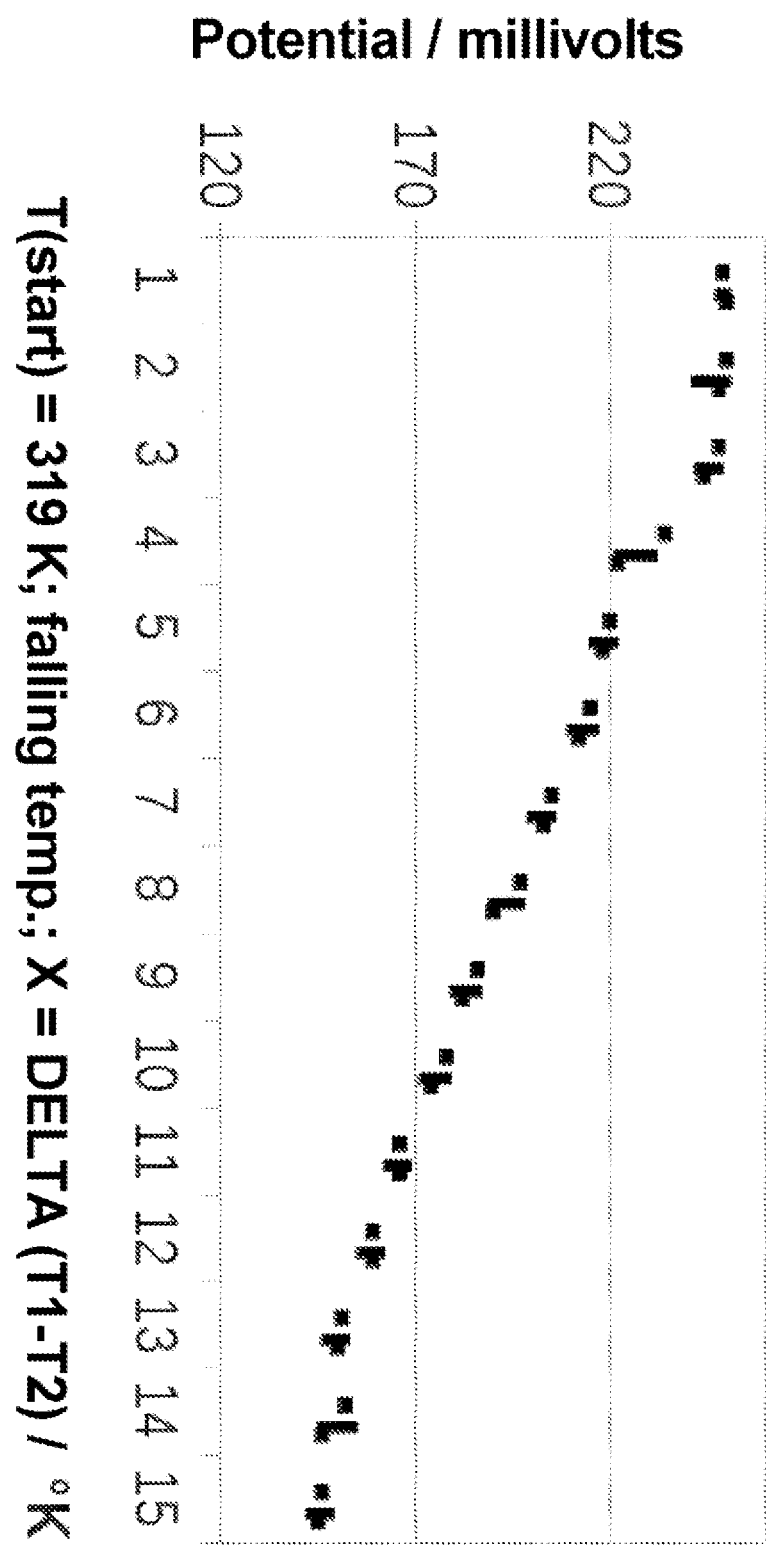
FIG. 4a measurement of the photovoltaic tappable potential from a PV double layer which could be generated merely by hot water placed to surround a PV double layer as a function of the temperature of the water/the cell falling from 46° C. to 31° C. with illustration of start value, variation and respective end value.

The top side of the double layer was provided with a finger electrode made of room temperature conducting silver from Busch and supplementally areally contacted with a transparent adhesively bondable ITO film. Subsequently the covering electrode and the bottom side electrode were contacted and the cell was investigated for PV activity. The double layer was initially investigated for PV activity by means of a cold light LED light source with visible light. Photovoltaic currents were weak to non-existent. Upon irradiation with a halogen lamp after a short warm-up phase of 1 to 4 seconds, clear photovoltaic potential differences beyond 100 mV were measured. It was possible to tap a constant load to operate an LED bicycle lamp. The question arises whether this is attributable to a Peltier effect. In order to test this the entire contacted cell was provided with thermocouples on the top side and bottom side, weld-wrapped in a watertight vacuum bag having implemented contact lines and completely submerged in 10 liters of hot water. After a heating time of about 5 minutes the temperature of all thermocouples was identical. The photovoltaic potential difference between the covering electrode and the bottom side electrode was significant and proportionally dependent on the cell temperature now falling slowly with the temperature of the water. The start value, end value and measured value variations occurring in between were digitally recorded and are reproduced in the graphic of FIG. 4. As is shown by FIG. 4a the measurement of the photovoltaic tappable potential from the PV double layer shows a proportional dependence on the temperature of the water falling from 46° C. to 31° C.: the lower the temperature the lower the tappable potential. However, the surrounding water ensures that no temperature gradient is measured here which in a Peltier element would be required for the then-measurable Seebeck effect. The temperature of the cell completely surrounded by uniformly heated water shows no gradients.

Verification of the removed and unpacked cell in a pizza oven showed, surprisingly, that up to 50° C. at a distance of the cell from the hot wall of the pizza oven no sufficient heat radiation reaches the cell. As shown by FIG. 4b the known light absorption maxima of H2O in air as a function of wavelength are significant in the wavelength range 5 to 10 micrometers.

The inventors believe that specifically hot water accordingly emits in this wavelength range and thus provides photons of appropriate energy with the highest efficiency in the chosen experimental set up. The measured results clearly indicate a utilizable band gap in the long wave to far IR range beyond 5 micrometers. However, this also means, conversely, that at high thermal incident radiation sufficient heat radiation would need to penetrate a thin air layer around the cell and be able to generate current. This was confirmed: in a pizza oven at 80° C. with a 2 cm air gap between the hot oven stone and the double layer the double layer produced and contacted as described hereinabove delivers clearly and distinctly measurable current which falls again proportionally to the temperature during cooling and gives way at about 60° C. The presently produced double layer sequence makes it possible to achieve advantageous photovoltaic utilization of long wave to extreme long wave light fractions right up to far IR radiation which in the prior art is a disadvantageously ignored and uninvestigated wavelength range. When the above-described cell is connected to a voltmeter and heated with a flat hand placed thereupon a potential difference is established which is proportional to the respective measurable surface temperature. Industrial waste heat and/or body heat in particular may be usefully and effectively utilized with the presently produced PV layer sequences.

INDUSTRIAL APPLICABILITY

It is a problem of processes according to the prior art that these always require a sintering step at elevated temperature. A further problem is that flexible thin layers, in particular PV layers, often do not tolerate such temperatures and additionally do not allow utilization of industrial waste heat and/or long wave photons.

The solution to these problems may be provided with a process where during hardening an additional reaction accelerates and improves hardening. This particularly advantageously allows a double layer sequence comprising a plastics matrix in which throughout metal particles are present and in a top layer base-solubilized siloxane fractions and metal particles are present, wherein through mutual final hardening during the base-solubilization it is made possible to produce a PV layer sequence with which industrial waste heat/long wave IR radiation becomes utilizable by photovoltaic means. The effective utilization of industrial waste heat/heat/body heat provides clear economic advantages in a great many fields.

The invention claimed is:
1. An infrared-sensitive photovoltaic (PV) device comprising a PV layer sequence formed at room temperature, the PV layer sequence comprising:
 a glass carrier
 a carrier electrode layer comprising silver, applied atop the glass carrier,
 a first layer applied atop the carrier electrode layer, the first layer comprising aluminium particles in a plastics matrix,
 a second layer applied atop the first layer, the second layer comprising an at least partially basic, glasslike layer having silicon-oxygen bridges in a glasslike network and further comprising partially base-solubilized aluminium particles as inorganic agglomerates, and
 a transparent covering electrode applied atop the second layer and having contact electrodes,
wherein the aluminium particles in the first layer and the partially base-solubilized aluminium particles in the second layer are interconnected, forming a junction operative to convert incident electromagnetic radiation into electric current, the conversion efficiency being highest in the infrared range, with wavelengths extending beyond 5 micrometers.

2. The PV device of claim 1, wherein any of said first layers and said second layer is formed of inorganic agglomerates areally provided in an aqueous dispersion.

3. The PV device of claim 2, wherein the hardening of any of said first layer and said second layer has been accelerated by exposure to a basic reagent in said second layer.

4. The PV device of claim 1, adapted to utilize industrial waste heat by converting electromagnetic radiation therefrom into electrical energy.

5. The PV device of claim 1, wherein said aluminium particles in both of said first layer and said second layer are aluminium flakes, configured to be interconnected in a scaffold arrangement.

* * * * *